United States Patent
Bae et al.

(10) Patent No.: US 8,791,558 B2
(45) Date of Patent: Jul. 29, 2014

(54) STACKED SEMICONDUCTOR PACKAGE

(75) Inventors: Jin Ho Bae, Icheon-si (KR); Ki Young Kim, Seongnam-si (KR); Jong Hyun Nam, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 563 days.

(21) Appl. No.: 12/980,772

(22) Filed: Dec. 29, 2010

(65) Prior Publication Data

US 2011/0193213 A1    Aug. 11, 2011

(30) Foreign Application Priority Data

Feb. 5, 2010 (KR) ................ 10-2010-0010906

(51) Int. Cl.
| | | |
|---|---|---|
| H01L 23/02 | (2006.01) | |
| H01L 23/48 | (2006.01) | |
| H01L 23/28 | (2006.01) | |
| H01L 23/52 | (2006.01) | |
| H01L 29/40 | (2006.01) | |

(52) U.S. Cl.
USPC ........... 257/686; 257/737; 257/777; 257/780; 257/784; 257/787; 257/E25.013; 361/735; 361/761

(58) Field of Classification Search
CPC ..... H01L 24/18; H01L 24/49; H01L 25/0652; H01L 25/0655; H01L 25/0657
USPC ................. 257/686, 777, 737, 780, 784, 787, 257/E25.013; 361/721, 722, 728, 729, 735, 361/761
See application file for complete search history.

(56) References Cited

U.S. PATENT DOCUMENTS

| | | | |
|---|---|---|---|
| 4,616,655 A * | 10/1986 | Weinberg et al. ................ 607/2 |
| 5,907,903 A * | 6/1999 | Ameen et al. .................. 29/830 |
| 6,555,917 B1 * | 4/2003 | Heo ............................. 257/777 |
| 6,621,155 B1 * | 9/2003 | Perino et al. .................. 257/686 |
| 6,734,539 B2 * | 5/2004 | Degani et al. ................. 257/686 |
| 6,891,239 B2 * | 5/2005 | Anderson et al. ............. 257/414 |
| 6,927,478 B2 * | 8/2005 | Paek ............................ 257/666 |
| 7,132,752 B2 * | 11/2006 | Saeki ........................... 257/777 |
| 2003/0127729 A1 * | 7/2003 | Fukumoto et al. ........... 257/723 |
| 2005/0140021 A1 * | 6/2005 | Wakisaka et al. ............ 257/777 |
| 2005/0263869 A1 * | 12/2005 | Tanaka et al. ................ 257/686 |
| 2007/0170573 A1 * | 7/2007 | Kuroda et al. ............... 257/686 |
| 2007/0187836 A1 * | 8/2007 | Lyne ............................ 257/777 |
| 2007/0246813 A1 * | 10/2007 | Ong et al. .................... 257/686 |
| 2008/0290491 A1 * | 11/2008 | Yamano et al. .............. 257/686 |
| 2009/0085223 A1 * | 4/2009 | Nishiyama et al. .......... 257/777 |
| 2009/0108470 A1 * | 4/2009 | Okada et al. ................. 257/777 |
| 2009/0152701 A1 * | 6/2009 | Kuan et al. ................... 257/686 |
| 2009/0201656 A1 * | 8/2009 | Shibuya ....................... 361/782 |
| 2009/0218669 A1 * | 9/2009 | Wang ........................... 257/686 |
| 2009/0309204 A1 * | 12/2009 | Ha ............................... 257/686 |
| 2009/0309205 A1 * | 12/2009 | Takahashi .................... 257/686 |
| 2010/0019359 A1 * | 1/2010 | Pagaila et al. ................ 257/659 |

* cited by examiner

*Primary Examiner* — Teresa M Arroyo
(74) *Attorney, Agent, or Firm* — William Park & Associates Patent Ltd.

(57) ABSTRACT

A stacked semiconductor chip includes a main substrate supporting a semiconductor chip module, wherein the semiconductor module comprises at least two sub semiconductor chip modules each having a sub substrate in which a first semiconductor chip is embedded and at least two second semiconductor chips are stacked on the sub substrate.

7 Claims, 5 Drawing Sheets

STACKED SEMICONDUCTOR PACKAGE

CROSS-REFERENCE TO RELATED APPLICATIONS

The present application claims priority to Korean patent application number 10-2010-10906 filed on Feb. 5, 2010, which is incorporated herein by reference in its entirety.

BACKGROUND OF THE INVENTION

The present invention relates to a semiconductor packaging technology, and more particularly, to a stacked semiconductor package.

In the semiconductor industry, packaging technologies for semiconductor devices have continuously been developed to meet the demands toward miniaturization and high capacity. Recently, various technologies for a stacked semiconductor package capable of meeting the demands toward miniaturization, high capacity and mounting efficiency have been developed.

The term "stack" referred to in the semiconductor industry means a technology of vertically placing at least two semiconductor chips or semiconductor packages. In the case of a memory device, by using the stack technology, it is possible to realize a product having a memory capacity greater than that achievable through general semiconductor integration processes, and mounting area utilization efficiency can be improved.

However, in order to manufacture a stacked semiconductor package, semiconductor chips should be vertically placed one by one. As the number of semiconductor chips to be stacked increases, a time required to manufacture a stacked semiconductor package is lengthened and the number of necessary processes increases. Also, if a failure occurs in any one of semiconductor package manufacturing processes, a corresponding semiconductor package is sorted to be a bad product. Thus, in a stacked semiconductor package, the possibility of a fail to occur increases with the number of chips/packages. For example, if sixteen chips are to be stacked, each of a chip attaching process and a wire bonding process should be performed sixteen times. Hence, a package manufacturing time is lengthened, and if a failure occurs even in any one of a number of processes, a corresponding semiconductor package is sorted to be a bad product. Namely, in a stacked semiconductor package, the possibility of a failure becomes substantial.

Further, since all stacked semiconductor chips should be connected with one substrate, it may be difficult or substantially impossible to design a substrate due to limitations in terms of positions of bonding pads in the semiconductor chips, positions of the semiconductor chips in the substrate, presence of a controller chip, and the area of the substrate. For example, connection pads of the substrate may be formed only on both sides of the semiconductor chips, and it may be impossible to form connection pads which are connected with the controller chip.

Moreover, if the number of semiconductor chips to be stacked increases, bonding wires for connecting the semiconductor chips with the substrate needs to be long. In this regard, if the lengths of the bonding wires increase, the probability of defects such as a short between the bonding wires or wire sweeping increases. When a test is performed after the manufacture of a package is completed, if a failure occurs in one semiconductor chip, all the other semiconductor chips that may be good in the package also need to be discarded, leading to waste of good semiconductor chips as well as waste of production time.

BRIEF SUMMARY OF THE INVENTION

An embodiment of the present invention is directed to a stacked semiconductor package which has a structure capable of shortening a manufacturing time, decreasing the number of processes and reducing the occurrence of failures.

In one embodiment of the present invention, a stacked semiconductor package includes a semiconductor chip module including at least two sub semiconductor chip modules each having a sub substrate which has a first surface with first sub connection pads formed thereon and a second surface facing away from the first surface and in which a first semiconductor chip with first bonding pads connected with the first sub connection pads is embedded and at least two semiconductor chips which are stacked over the first surface and each of which has second bonding pads connected with the first sub connection pads, and a main substrate supporting the semiconductor chip module and having main connection pads which are connected with the respective first sub connection pads.

The sub substrate may include: a support layer attached to the second surface of the first semiconductor chip facing away from the first surface of the first semiconductor chip over which the first bonding pads are disposed; bumps formed over the first bonding pads and connecting the first bonding pads with the first sub connection pads; an insulation layer covering an upper surface of the support layer including the first semiconductor chip, exposing upper ends of the bumps, and supporting the first sub connection pads; and a solder resist formed over the insulation layer to expose the first sub connection pads.

The second semiconductor chips may be stacked to be offset from one another such that the respective second bonding pads are exposed.

The first sub connection pads and the respective second bonding pads may be connected with each other by the medium of bonding wires.

The first sub connection pads and the main connection pads may be connected with each other by the medium of bonding wires.

The stacked semiconductor package may further include: a controller chip attached onto the semiconductor chip module and having third bonding pads which are connected with the first sub connection pads of any one sub semiconductor chip module among the sub semiconductor chip modules constituting the semiconductor chip module.

The third bonding pads and the first sub connection pads may be connected with each other by the medium of bonding wires.

The sub substrate included in at least one sub semiconductor chip module among the sub semiconductor chip modules may include: second sub connection pads formed over the first surface and connected with the main connection pads; and a controller chip embedded along with the first semiconductor chip on a side of the first semiconductor chip and having third bonding pads which are connected with the second sub connection pads.

The sub substrate including the controller chip may include a support layer attached to the second surface of the first semiconductor chip facing away from the first surface of the first semiconductor chip over which the first bonding pads are disposed, first bumps formed over the first bonding pads and connecting the first bonding pads with the first sub connection pads, second bumps formed over the third bonding pads and connecting the third bonding pads with the second sub connection pads, an insulation layer covering an upper surface of the support layer including the first semiconductor chip and the controller chip, exposing upper ends of the first and second bumps, and supporting the first and second sub connection pads, and a solder resist formed over the insulation layer to expose the first and second sub connection pads.

The main connection pads and the second sub connection pads may be connected with each other by the medium of bonding wires.

The second sub connection pads and the third bonding pads may be connected with each other by the medium of bonding wires.

In another embodiment of the present invention, a stacked semiconductor package includes a main substrate having an upper surface over which main connection pads are formed and a lower surface which faces away from the upper surface, at least two first semiconductor chips stacked over the upper surface and having first bonding pads which are connected with the main connection pads, and at least one sub semiconductor chip module stacked over the first semiconductor chips, the sub semiconductor chip module having a sub substrate which has a first surface with sub connection pads formed thereon and connected with the main connection pads and a second surface facing away from the first surface and in which a second semiconductor chip with second bonding pads connected with the sub connection pads is embedded and at least two third semiconductor chips which are stacked over the first surface and have third bonding pads connected with the sub connection pads.

The sub substrate may include a support layer attached to the second surface of the second semiconductor chip facing away from the first surface of the second semiconductor chip over which the second bonding pads are disposed, bumps formed over the second bonding pads and connecting the second bonding pads with the sub connection pads, an insulation layer covering an upper surface of the support layer including the second semiconductor chip, exposing upper ends of the bumps, and supporting the sub connection pads, and a solder resist formed over the insulation layer to expose the sub connection pads.

The first semiconductor chips may be stacked to be offset from one another such that the first bonding pads are exposed.

The main connection pads and the first bonding pads may be connected with each other by the medium of bonding wires.

The sub connection pads and the main connection pads may be connected with each other by the medium of bonding wires.

The third semiconductor chips may be stacked to be offset from one another such that the third bonding pads are exposed.

The sub connection pads and the respective third bonding pads may be connected with each other by the medium of bonding wires.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
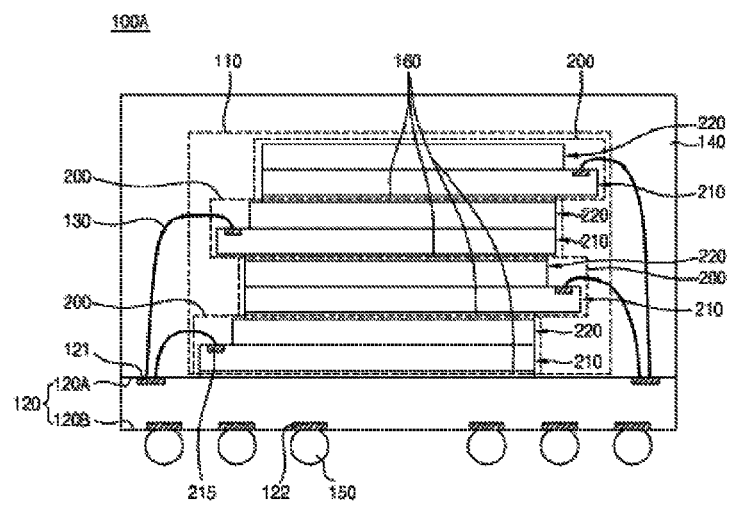
FIG. 1 is a cross-sectional view illustrating a stacked semiconductor package in accordance with a first embodiment of the present invention.
Figure 2:
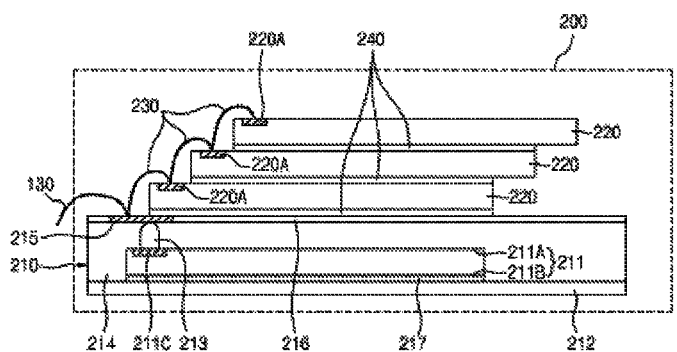
FIG. 2 is a view illustrating the construction of a sub semiconductor chip module shown in FIG. 1.

FIG. 1 is a cross-sectional view illustrating a stacked semiconductor package in accordance with a first embodiment of the present invention, and FIG. 2 is a view illustrating the construction of a sub semiconductor chip module shown in FIG. 1.

Referring to FIG. 1, a stacked semiconductor package 100 in accordance with a first embodiment of the present invention includes a semiconductor chip module 110, a main substrate 120, and first connection members 130. The stacked semiconductor package 100 can further include an encapsulation member 140, and external connection terminals 150.

The semiconductor chip module 110 includes at least two sub semiconductor chip modules 200. In the present embodiment, the semiconductor chip module 110 includes four sub semiconductor chip modules 200.

Referring to FIG. 2, each of the sub semiconductor chip modules 200 includes a sub substrate 210 in which a first semiconductor chip 211 is embedded and which has sub connection pads 215 connected to the main substrate 120, one or more second semiconductor chips 220 which are stacked on the sub substrate 210, and second connection members 230.

The sub substrate 210 includes the first semiconductor chip 211, a support layer 212, bumps 213, an insulation layer 214, the sub connection pads 215, and a solder resist 216.

The first semiconductor chip 211 has a first surface 211A and a second surface 211B which faces away from the first surface 211A. For example, the first surface 211A may be a top surface and the second surface 211B may be a bottom surface. First bonding pads 211C are formed on the first surface 211A of the first semiconductor chip 211, and the second surface 211B of the first semiconductor chip 211 is attached to the support layer 212 by the medium of an adhesive member 217. The first semiconductor chip 211 includes a circuit unit (not shown) therein, and the first bonding pads 211C serve as electrical contacts of the circuit unit for exterior connection.

The bumps 213 are formed on the first bonding pads 211C. The insulation layer 214 is formed to cover the upper surface of the support layer 212 including the first semiconductor chip 211 and expose upper ends of the bumps 213. The sub connection pads 215 are formed on the insulation layer 214 to be connected with the bumps 213, and the solder resist 216 is formed on the insulation layer 214 to expose the sub connection pads 215.

In the present embodiment, the sub semiconductor chip module 200 includes three second semiconductor chips 220 which are stacked on the sub substrate 210. The three second semiconductor chips 220 are stacked on the sub substrate 210 by the medium of adhesive members 240. Each of the second semiconductor chips 220 has a first surface, for example, a top surface which faces away from the sub substrate 210 and a second surface, for example, a bottom surface which faces away from the first surface. Second bonding pads 220A are formed on the first surface of the second semiconductor chip 220. The second semiconductor chip 220 includes a circuit unit (not shown) therein, and the second bonding pads 220A serve as electrical contacts of the circuit unit for exterior connection.

The second semiconductor chips 220 are stacked to be offset from one another such that the second bonding pads 220A are exposed. In the present embodiment, the second semiconductor chips 220 are stacked in step-like shapes such that the second bonding pads 220A are exposed.

The second connection members 230 connect the second bonding pads 220A included in different second semiconductor chips 220 with one another and with the sub connection pads 215. The second connection members 230 can include bonding wires.

Referring back to FIG. 1, the semiconductor chip module 110 has a structure in which two or more sub semiconductor chip modules 200 configured as mentioned above are attached to one another by the medium of adhesive members 160. In the present embodiment, the semiconductor chip module 110 comprises four sub semiconductor chip modules 200. The four sub semiconductor chip modules 200 are stacked to be offset from one another such that the sub connection pads 215 (shown in FIG. 2) are exposed.

The semiconductor chip module 110 is attached to the main substrate 120 by the medium of an adhesive member 160 and is supported by the main substrate 120.

The main substrate 120 has an upper surface 120A which faces the semiconductor chip module 110, and a lower surface 120B which faces away from the semiconductor chip module 110. Main connection pads 121 are formed on the upper surface 120A of the main substrate 120 on both sides of the semiconductor chip module 110, and ball lands 122 are formed on the lower surface 120B of the main substrate 120. The external connection terminals 150 such as solder balls are attached to the ball lands 122.

The first connection members 130 connect the sub connection pads 215 of the sub semiconductor chip modules 200 with the main connection pads 121 of the main substrate 120. The first connection members 130 can include bonding wires.

The encapsulation member 140 seals the upper surface 120A of the main substrate 120 including the semiconductor chip module 110.

Figure 3:
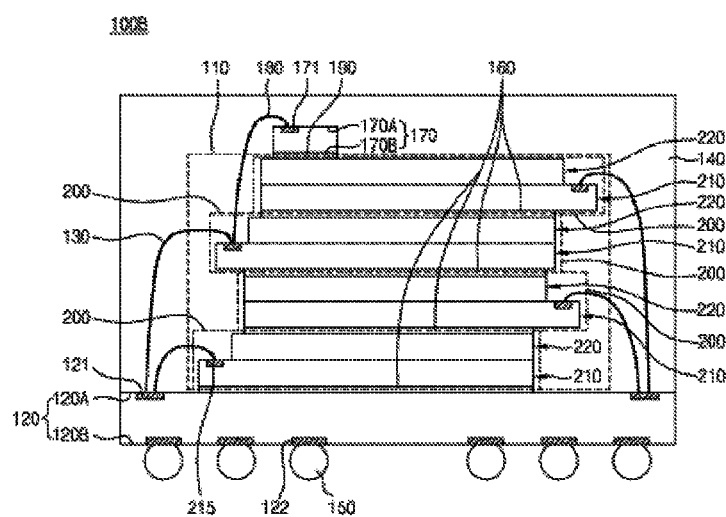
FIG. 3 is a cross-sectional view illustrating a stacked semiconductor package in accordance with a second embodiment of the present invention.

FIG. 3 is a cross-sectional view illustrating a stacked semiconductor package in accordance with a second embodiment of the present invention.

The stacked semiconductor package in accordance with the second embodiment of the present invention has a construction in which a controller chip 170 and third connection members 180 are added to the stacked semiconductor package in accordance with the first embodiment of the present invention described above with reference to FIGS. 1 and 2. Therefore, the stacked semiconductor package in accordance with the second embodiment of the present invention has substantially the same construction as the stacked semiconductor package in accordance with the first embodiment of the present invention, except for the controller chip 170 and the third connection members 180. Accordingly, repeated descriptions for the same component elements will be omitted herein, and the same technical terms and the same reference numerals will be used to refer to the same component elements.

Referring to FIG. 3, a stacked semiconductor package 100 includes a semiconductor chip module 110, a main substrate 120, first connection members 130, the controller chip 170, and the third connection members 180. The stacked semiconductor package 100 can further include an encapsulation member 140, and external connection terminals 150.

The semiconductor chip module 110 has substantially the same construction as the semiconductor chip module of the stacked semiconductor package in accordance with the first embodiment of the present invention described above with reference to FIGS. 1 and 2.

The controller chip 170 is attached to the semiconductor chip module 110 by the medium of an adhesive member 190. The controller chip 170 has a first surface 170A which faces away from the semiconductor chip module 110 and a second surface 170B which faces the semiconductor chip module 110. The second surface 170B of the controller chip 170 is attached to the semiconductor chip module 110 by the medium of the adhesive member 190, and third bonding pads 171 are formed on the first surface 170A of the controller chip 170.

The controller chip 170 includes a circuit unit (not shown) therein, and the third bonding pads 171 serve as electrical contacts of the circuit unit for exterior connection.

The third bonding pads 171 are connected with the sub connection pads 215 of any one sub semiconductor chip module 200 among the sub semiconductor chip modules 200 included in the semiconductor chip module 110, by the medium of the third connection members 180. The third connection members 180 include bonding wires.

Figure 4:
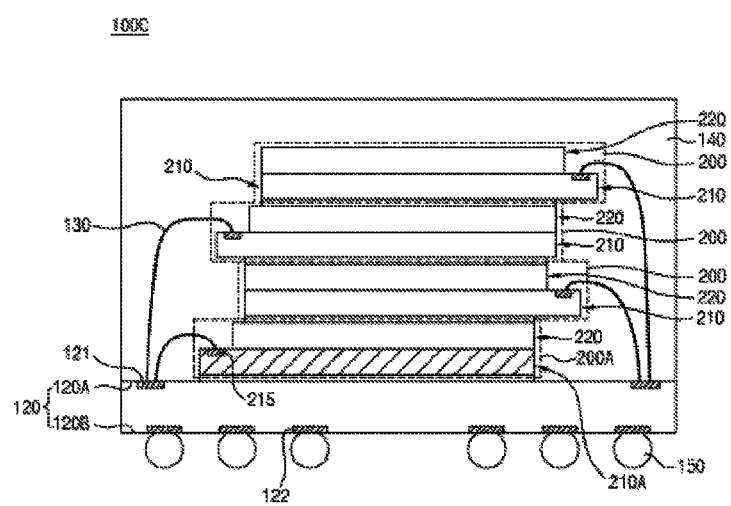
FIG. 4 is a cross-sectional view illustrating a stacked semiconductor package in accordance with a third embodiment of the present invention.
Figure 5:
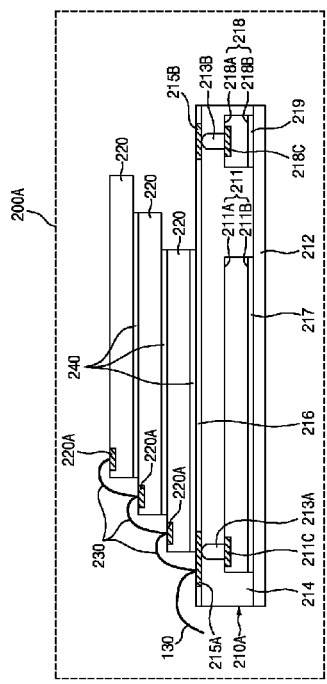
FIG. 5 is a view illustrating the construction of a sub semiconductor chip module with a sub substrate in which a controller chip is embedded in FIG. 4.

FIG. 4 is a cross-sectional view illustrating a stacked semiconductor package in accordance with a third embodiment of the present invention, and FIG. 5 is a view illustrating the construction of a sub semiconductor chip module with a sub substrate in which a controller chip is embedded in FIG. 4.

The stacked semiconductor package in accordance with the third embodiment of the present invention has substantially the same construction as the stacked semiconductor package in accordance with the first embodiment of the present invention described above with reference to FIGS. 1 and 2, except for a sub semiconductor chip module having a sub substrate in which a controller chip is embedded. Accordingly, repeated descriptions for the same component elements will be omitted herein, and the same technical terms and the same reference numerals will be used to refer to the same component elements.

Referring to FIG. 4, a stacked semiconductor package 100 includes a semiconductor chip module 110, a main substrate 120, and first connection members 130. The stacked semiconductor package 100 can further include an encapsulation member 140, and external connection terminals 150.

Referring to FIG. 4, the semiconductor chip module 110 includes at least one sub semiconductor chip module 200 having a sub substrate 210 in which a controller chip is not embedded and at least one sub semiconductor chip module 200A having a sub substrate 210A in which a controller chip is embedded.

The sub semiconductor chip module 200 having the sub substrate 210 in which a controller chip is not embedded has substantially the same construction as the sub semiconductor chip module 200 shown in FIG. 2. Accordingly, repeated descriptions for the same component elements will be omitted herein.

Referring to FIG. 5, the sub semiconductor chip module 200A having the sub substrate 210A in which a controller chip 218 is embedded has substantially the same construction as the sub semiconductor chip module 200 shown in FIG. 2, except the construction of the sub substrate 210A. Accordingly, repeated descriptions for the same component elements will be omitted herein.

In detail, the sub substrate 210A of the sub semiconductor chip module 200A, in which the controller chip 218 is embedded, includes a first semiconductor chip 211, a support layer 212, first and second bumps 213A and 213B, an insulation layer 214, first and second sub connection pads 215A and 215B, a solder resist 216, and the controller chip 218.

The first semiconductor chip 211 has a first surface 211A and a second surface 211B which faces away from the first surface 211A. First bonding pads 211C are formed on the first surface 211A of the first semiconductor chip 211, and the second surface 211B of the first semiconductor chip 211 is attached to the support layer 212 by the medium of an adhesive member 217. The first semiconductor chip 211 includes a circuit unit (not shown), and the first bonding pads 211C serve as electrical contacts of the circuit unit for outside connection.

The controller chip 218 is attached to the support layer 212 by the medium of an adhesive member 219 in such a way as to be separated from the first semiconductor chip 211. The controller chip 218 has a first surface 218A which faces away from the support layer 212 and a second surface 218B which faces away from the first surface 218A. Third bonding pads 218C are formed on the first surface 218A of the controller chip 218.

The first bumps 213A are formed on the first bonding pads 211A of the first semiconductor chip 211, and the second bumps 213B are formed on the third bonding pads 218C of the controller chip 218. The insulation layer 214 is formed to cover the support layer 212 including the first semiconductor chip 211 and the controller chip 218 and expose upper ends of the first and second bumps 213A and 213B. The first sub connection pads 215A are formed on the insulation layer 214 to be connected with the first bumps 213A, and the second sub connection pads 215B are formed on the insulation layer 214 to be connected with the second bumps 213B. The solder resist 216 is formed on the insulation layer 214 to expose the first and second sub connection pads 215A and 215B.

Figure 6:
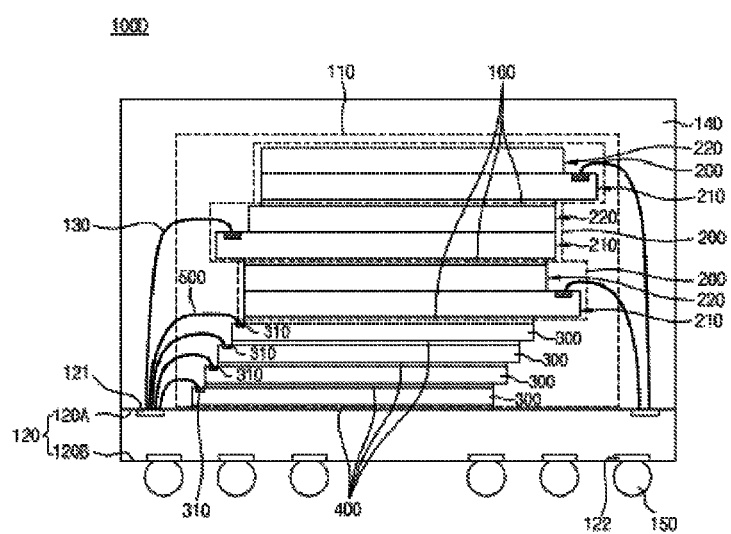
FIG. 6 is a cross-sectional view illustrating a stacked semiconductor package in accordance with a fourth embodiment of the present invention.

FIG. 6 is a cross-sectional view illustrating a stacked semiconductor package in accordance with a fourth embodiment of the present invention.

A stacked semiconductor package 100 in accordance with a fourth embodiment of the present invention includes a semiconductor chip module 110, a main substrate 120, and first connection members 130. The stacked semiconductor package 100 can further include an encapsulation member 140, and external connection terminals 150.

The semiconductor chip module 110 includes at least two fourth semiconductor chips 300, and one or more sub semiconductor chip modules 200 which are stacked on the fourth semiconductor chips 300. In the present embodiment, the semiconductor chip module 110 includes four fourth semiconductor chips 300 and three sub semiconductor chip modules 200, which are stacked on the main substrate 120.

The fourth semiconductor chips 300 are stacked on the main substrate 120 by the medium of adhesive members 400. Each of the fourth semiconductor chips 300 has a first surface which faces away from the main substrate 120 and a second surface which faces away from the first surface. Fourth bonding pads 310 are formed on the first surface of the fourth semiconductor chip 300. The fourth semiconductor chip 300 includes a circuit unit (not shown) therein, and the fourth bonding pads 310 serve as electrical contacts of the circuit unit for outside connection.

The fourth semiconductor chips 300 are stacked to be offset from one another such that the fourth bonding pads 310 are exposed. In the present embodiment, the fourth semiconductor chips 300 are stacked in step-like shapes such that the fourth bonding pads 310 are exposed.

Fourth connection members 500 connect the fourth bonding pads 310 with main connection pads 121. The fourth connection members 500 can include bonding wires.

The sub semiconductor chip modules 200 are stacked on the fourth semiconductor chips 300 by the medium of adhesive members 160.

The sub semiconductor chip module 200 has substantially the same construction as that of the stacked semiconductor package in accordance with the first embodiment described above with reference to FIGS. 1 and 2. Accordingly, repeated descriptions for the same component elements will be omitted herein, and the same technical terms and the same reference numerals will be used to refer to the same component elements.

As is apparent from the above descriptions, in the embodiments of the invention, since a stacked semiconductor package is constructed not by the unit of a chip but by the unit of a sub semiconductor chip module having a structure in which a plurality of semiconductor chips are stacked, a time required to manufacture the stacked semiconductor package can be shortened. Also, because the stacked semiconductor package can be constructed by using only sub semiconductor chip modules which are sorted through tests to be good, it is possible to reduce the occurrence of fails in the stacked semiconductor package due to presence of fails in semiconductor chips or fails caused when stacking the semiconductor chips.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a main substrate having an upper surface on which main connection pads are formed and a lower surface which faces away from the upper surface;
   at least two first semiconductor chips stacked on the upper surface and each having first bonding pads which are connected with the main connection pads; and
   at least one sub semiconductor chip module stacked on the first semiconductor chips,
   the sub semiconductor chip module having a sub substrate which has a first surface with sub connection pads formed thereon and connected with the main connection pads, and a second surface facing away from the first surface, and in which a second semiconductor chip with second bonding pads connected with the sub connection pads is embedded, and at least two third semiconductor chips which are stacked on the first surface and have third bonding pads connected with the sub connection pads.

2. The stacked semiconductor package according to claim 1, wherein the sub substrate comprises:
   a support layer attached to the other surface of the second semiconductor chip facing away from one surface of the second semiconductor chip on which the second bonding pads are disposed;

bumps formed on the second bonding pads and connecting the second bonding pads with the sub connection pads;

an insulation layer covering an upper surface of the support layer including the second semiconductor chip, exposing upper ends of the bumps, and supporting the sub connection pads; and a solder resist formed on the insulation layer to expose the sub connection pads.

3. The stacked semiconductor package according to claim 1, wherein the first semiconductor chips are stacked to deviate from one another such that the first bonding pads are exposed.

4. The stacked semiconductor package according to claim 1, wherein the main connection pads and the first bonding pads are connected with each other by the medium of bonding wires.

5. The stacked semiconductor package according to claim 1, wherein the sub connection pads and the main connection pads are connected with each other by the medium of bonding wires.

6. The stacked semiconductor package according to claim 1, wherein the third semiconductor chips are stacked to deviate from one another such that the third bonding pads are exposed.

7. The stacked semiconductor package according to claim 1, wherein the sub connection pads and the respective third bonding pads are connected with each other by the medium of bonding wires.

* * * * *